United States Patent [19]

Lutz et al.

[11] Patent Number: 4,919,076

[45] Date of Patent: Apr. 24, 1990

[54] REUSABLE EVAPORATION FIXTURE

[75] Inventors: David L. Lutz, Bealeton; Keith W. Meranda; Russell B. Minter, both of Manassas, all of Va.

[73] Assignee: International Business Machines Corporation, Armonk, N.Y.

[21] Appl. No.: 252,828

[22] Filed: Oct. 3, 1988

[51] Int. Cl.$^5$ ............................................. C23C 16/04
[52] U.S. Cl. .................................. 118/721; 118/505; 118/728; 204/298.11
[58] Field of Search ............... 118/504, 505, 720, 721, 118/728, 732; 427/282; 204/298

[56] References Cited

U.S. PATENT DOCUMENTS

| | | | |
|---|---|---|---|
| 2,767,684 | 10/1956 | Weimer et al. | |
| 3,897,324 | 7/1975 | Del Monte et al. | 204/298 |
| 3,983,838 | 10/1976 | Christensen | 118/49 |
| 4,372,248 | 2/1983 | Martin | 118/720 |
| 4,373,470 | 2/1983 | Martin | 118/720 |
| 4,492,180 | 1/1985 | Martin | 118/704 |
| 4,549,843 | 10/1985 | Jagusch et al. | 414/416 |
| 4,633,810 | 1/1987 | Martin | 118/721 |
| 4,676,193 | 6/1987 | Martin | 118/720 |
| 4,724,621 | 2/1988 | Hobson et al. | 34/218 |
| 4,777,909 | 10/1988 | Martin | 118/721 |

FOREIGN PATENT DOCUMENTS

| | | | |
|---|---|---|---|
| 2146254 | 6/1987 | Japan | 118/720 |
| 2164866 | 7/1987 | Japan | 118/720 |
| 2164867 | 7/1987 | Japan | 118/720 |

OTHER PUBLICATIONS

Brewer, G. W. et al., "Apparatus for Depositing Thin Film Devices", IBM Technical Disclosure Bulletin, vol. 21, No. 7 (Dec. 1978), pp. 3016–3018.

Primary Examiner—Richard Bueker
Assistant Examiner—Terry J. Owens
Attorney, Agent, or Firm—Jeffrey S. LaBaw

[57] ABSTRACT

A reusable evaporation fixture for aligning a plurality of small individual substrates to a single contact mask is described. The fixture preferably includes a series of thin inner plates held together by a base plate and top plate. One of the inner plates includes a plurality of spring means corresponding to the plurality of individual substrates to be masked. Each spring means forces individual substrate against the contact mask to prevent haloing of the deposition pattern. Another of the inner plates has a plurality of pockets and spring means within those pockets which force the individual substrates against the alignment faces of the pockets, to align and secure the individual substrates in the X-Y plane. Once the individual substrates have been placed in the pockets provided by the inner plates, the contact mask is placed over the inner plates, and a top plate is placed over the entire assembly. The top plate shields the parts of the reusable evaporation fixture during deposition, so that only the top plate and the mask must be cleaned. The use of spring means in the inner plates compensates for dimensional tolerance between the individual substrates.

15 Claims, 6 Drawing Sheets

REUSABLE EVAPORATION FIXTURE

BACKGROUND OF THE INVENTION

This invention generally relates to accurately registering a contact mask to a substrate for a subsequent thin-film deposition. More particularly, it relates to an evaporation fixture which accurately registers a plurality of small substrates to a single metal contact mask for use in a thin film deposition process.

The use of a contact mask to control the pattern of material deposition on a semiconductor wafer, or other substrate, is well-known. Openings are provided in the contact mask in a pattern which corresponds to the desired pattern of the material to be deposited on the substrate. The contact mask is then placed against the surface of the substrate and one or more materials are deposited on the substrate through the patterned arrangement of the openings in the mask. Contact masks are frequently used where metallic material is deposited on integrated circuit semiconductor wafers which are thereafter mounted on various electronic devices.

However, prior art techniques for registering contact masks to substrates have been limited to mating a single substrate to a single mask. If more than one substrate is to be patterned on a given deposition run, the prior art teaches that a separate contact mask must be used for each substrate. This becomes incredibly time consuming when thousands of very small individual substrates must be masked. The prior art does not address a situation where multiple small substrates must be aligned and registered to a single contact mask.

Several problems are encountered when multiple small substrates are registered to a single mask, which are either not found with single mask, single substrate arrangements, or are greatly exacerbated with multiple substrates. One of the more critical concerns for a contact mask is that the substrate must be in uniform contact with that mask; otherwise, haloing of the deposited material under the mask will occur on the substrate; i.e., material will be deposited in areas outside those intended. To prevent haloing, the mask should be very flat against the substrate. Assuring good mask contact has been accomplished in the prior art by flexing the contact mask tightly against the flat surface of the substrate. However, this method is not useful when a collection of substrates of a variety of thicknesses and which do not present a uniform and planar face area to flex the contact mask against.

A second problem occurs in aligning each individual chip or substrate to the contact mask in the X-Y plane. This is simply not addressed in the prior art as there is but a single substrate to align to the contact mask. One known strategy for aligning a contact mask to a substrate is the use of several alignment pins and several complementary alignment pin receiving means. Generally, the substrate is seated in the holder and has alignment pins which mate with the alignment receiving means present either on the contact mask or on a mask holder in which the mask is encased. This works well where a single substrate and single mask are used. However, where a plurality of substrates of varying dimensions in length and width, a limited number of alignment pins will not do an adequate job. Other means used in the prior art include multiple cams or clamping pins.

Another problem encountered in contact mask deposition is to separate the individual chip from the contact mask after deposition. A typical film deposited through a contact mask onto a substrate would be a thick metal film with substantial tensile and bonding strength. Where a single substrate is used, it is relatively easy to hold the substrate while the contact mask is peeled off. However, the problems of holding each individual chip in place while a contact mask is removed are much greater.

After the material is deposited in the desired pattern on the substrate, the mask and at least some of the parts of the evaporation fixture must be cleaned. It would be desirable if an evaporation fixture were designed so that minimum number of parts needed to be cleaned to minimize labor and the number of extra parts needed for the evaporation fixture in a manufacturing mode.

SUMMARY OF THE INVENTION

It is therefore an object of the invention to register a plurality of individual substrates to a single contact mask in the X-Y plane.

It is another object of the invention to force each individual substrate against the contact mask in the Z-direction to prevent haloing of deposited material on the substrates.

It is yet another object of the invention to accommodate a plurality of individual substrates of varying thicknesses, lengths, and widths within a reusable evaporation fixture.

It is still another object of the invention to minimize the number of parts to be cleaned in a reusable evaporation fixture.

It is still yet another object of the invention to secure the individual substrates within the fixture as the contact mask is removed.

These and other objects of the invention are accomplished within a reusable evaporation fixture. The fixture includes a contact mask in the X-Y plane, a series of thin inner plates held parallel to the X-Y plane defined by the contact mask, and a base plate and top plate. One of the inner plates, the Z-spring plate is supported by the base plate and includes a plurality of spring means corresponding to a plurality of individual substrates to be masked. Each spring means forces an individual substrate securely against the contact mask in the Z-direction, perpendicular to the X-Y plane. The Z-spring plate can compensate for variations in thickness between the substrates and prevents haloing of the deposition pattern. Another of the inner plates, the X-Y positioning plate, provides a plurality of pockets having alignment faces to which each of the plurality of individul substrates can be registered. The X-Y positioning plate acts together with the X-Y spring plate, which has a plurality of spring means which force the substrates against the alignment faces of the pockets, to align and secure the individual substrates in a plane parallel to the X-Y plane defined by the contact mask. Once the individual substrates have been placed in the pockets, the contact mask is placed over the inner plates, and a top plate is placed over the entire assembly. The top plate shields the parts of the reusable evaporation fixture during deposition, so that only the top plate and the mask need to be cleaned, greatly reduing the number of fixtures which must be fabricated and labor costs associated with cleaning. The force provided by the spring means in the X-Y spring plate is sufficient to hold the substrates in place when the contact mask is removed.

BRIEF DESCRIPTION OF THE DRAWINGS

The foregoing and other advantages and features of this invention will be apparent from the following description of the preferred embodiment, when considered together with the illustrations in the accompanying drawings, which include the following Figures.

DETAILED DESCRIPTION OF THE DRAWINGS

Figure 1C:
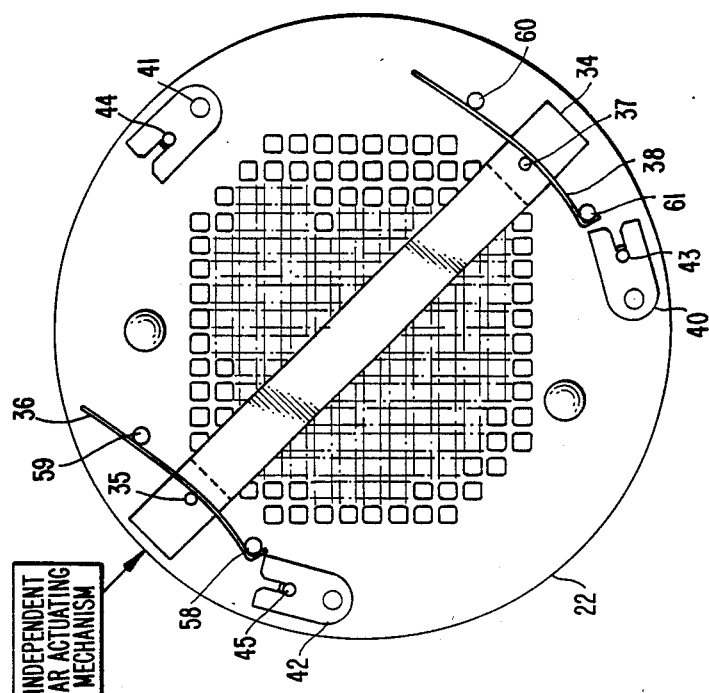
FIG. 1C is a bottom view of the reusable evaporation fixture when assembled.
Figure 1B:
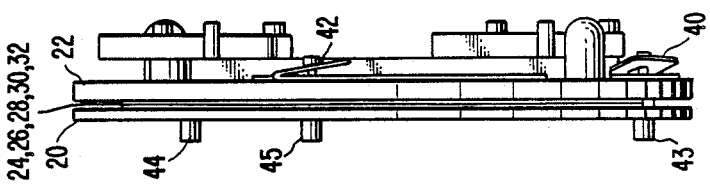
FIG. 1B is a side view of the reusable evaporation fixture when assembled.
Figure 1A:
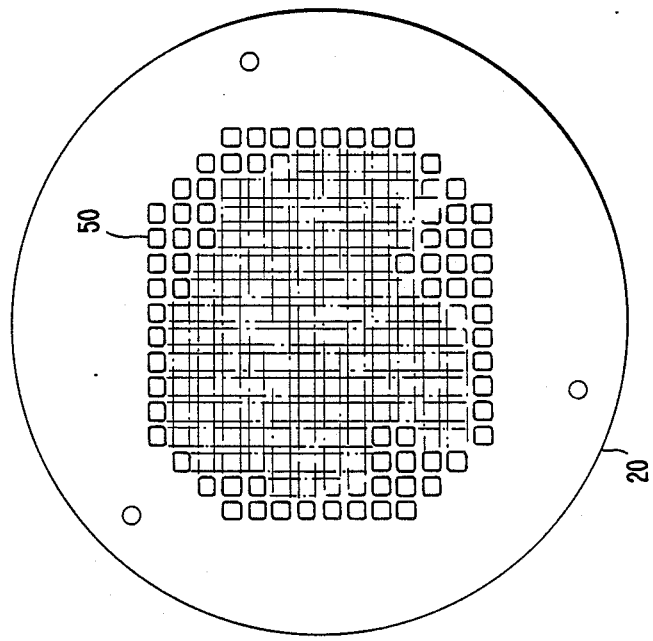
FIG. 1A is a top view of the reusable evaporation fixture when assembled.

FIGS. 1A, 1B and 1C illustrate, respectively, the top, side and bottom views of the reusable evaporation fixture when assembled. The reusable evaporation fixture, as assembled, includes a top plate 20, a bottom plate 22, which sandwich a Z-spring plate 24, a first X-Y positioning plate 26, a X-Y spring plate 28, a second X-Y positioning plate 30 and a contact mask 32. The reusable evaporation fixture is in part aligned in the X-Y plane by the slide bar 34 together with leaf springs 36 and 38, and held together in the Z-direction, by spring clips 40, 41 and 42, and clip pins 43, 44 and 45. As can be seen in FIG. 1A, the top plate 20 shields much of the assembly from the deposited material. The material to be deposited goes through the top plate 20 at openings 50 and is deposited on the substrates in the pattern determined by the geometric arrangement of the openings of contact mask 32.

Figure 2A:
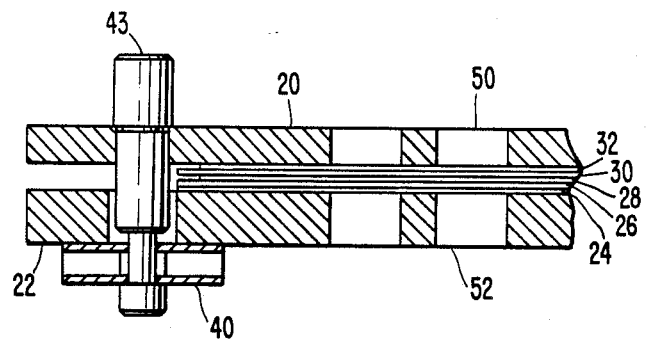
FIG. 2 is a cross-section view of the reusable evaporation fixture when assembled.
Figure 2B:
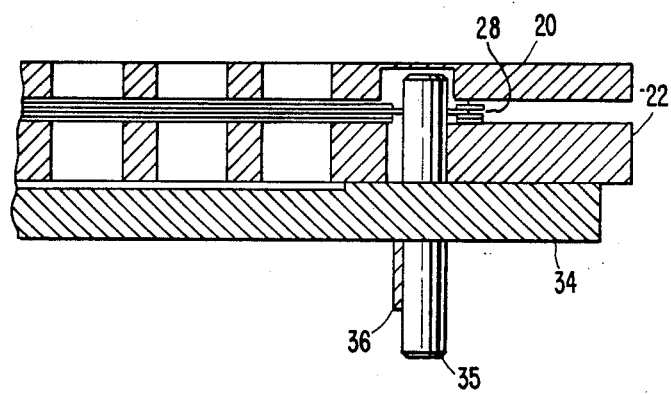

Referring to FIG. 2, the reusable evaporation fixture is shown in cross-section. As can be seen, clip in 43, which is an integral to the top plate 20, goes through an aperture in base plate 22, and is clipped by spring clip 40. Similarly, slide bar pin 35 goes through apertures in the base plate 22 and in intermediate plates 24, 26, 28, 30 and 32, to help register and activate the X-Y spring plate 28 of the reusable evaporation fixture in the X-Y direction. Slide bar 34 is held by the action of leaf springs 36 and 38 against slide bar pins 35 and 37.

The reusable evaporation fixture is assembled by first securing the slide bar 34 onto the bottom of base plate 22, as shown in FIG. 1C. Leaf springs 36 and 38 are clipped between spring pins 58, 59, 60 and 61 and slide bar pins 35 and 37 to secure the slide bar 34 to the base plate 22. Next, the Z-spring plate 24 is placed on the base plate 22 using locating pins 54 and 56 to align the Z-spring plate 24 to the base plate 22. Next, the first X-Y positioning plate 26 is placed over the Z-spring plate 24 using locating pins 54 and 56 to align the first X-Y positioning plate 26. The X-Y spring plate 28 is then placed over the first X-Y positioning plate 26 using slide bar pins 35 and 37 to align the plate 28 with the rest of the assembly. Next, the second X-Y positioning plate 30 is placed over the X-Y spring plate 28 using locating pins 54 and 56. The entire assembly is then placed in an independent bar actuating fixture (not shown) which pushes the slide bar 34 against the action of the leaf springs 36 and 38 in the direction portrayed by the arrow to the "load" position as shown in FIG. 1C. In the preferred embodiment, the slide bar 34 and X-Y spring plate 24 are tied together via slide bar pins 35 and 36 so that any movement of the slide bar 34 also moves the X-Y spring plate 28 in the same direction. Alignment holes 84 and 86, shown in FIG. 6A, on the x-y spring plate 28 fit over slide bar pins 35 and 37 to link the slide bar 34 and x-y spring plate 28 together. Once the X-Y spring plate 28 is in the "load" position, all the individual substrates are dropped into substrate pockets formed by plates 26, 28 and 30, which correspond to the position of the bottom plate openings 52. Each substrate occupies an individual position supported by Z-spring plate 24. The contact mask 32 is placed over substrates using locating pins 54 and 56 to align the mask 32. In the preferred embodiment, plates 24, 26, 30 and contact mask 32 are accurately aligned via locating pins 54 and 56, while X-Y spring plate 28 is generally aligned by the locating pins 54 and 56 and is also more precisely aligned via slide bar pins 35 and 37. Next, the independent slide bar mechanism stops pushing in the direction of the arrow the slide bar 34 allowing leaf springs 36 and 38 to move the slide bar 34 and the x-y spring plate 28 away from the "load" position and the X-Y spring plate 28 pushes all the substrates simultaneously against the locating surfaces 82 and 83 on X-Y locating plates 26 and 30 down in FIGS. 5A and 5B. The action of the x-y spring plate 28 against the substrates to align them against in locating surfaces 82 and 83 the x-y locating plates 26 and 30 is explained in greater detail below in connection with FIGS. 5A and 5B and FIGS. 6A and 6B. Finally, the top plate 20 is placed over the assembly to allow clip pins 43, 44 and 45 to pass through the apertures in the base plate 22 so that spring clips 40, 41 and 42 fasten the entire reusable evaporation fixture assembly together.

Figure 3A:
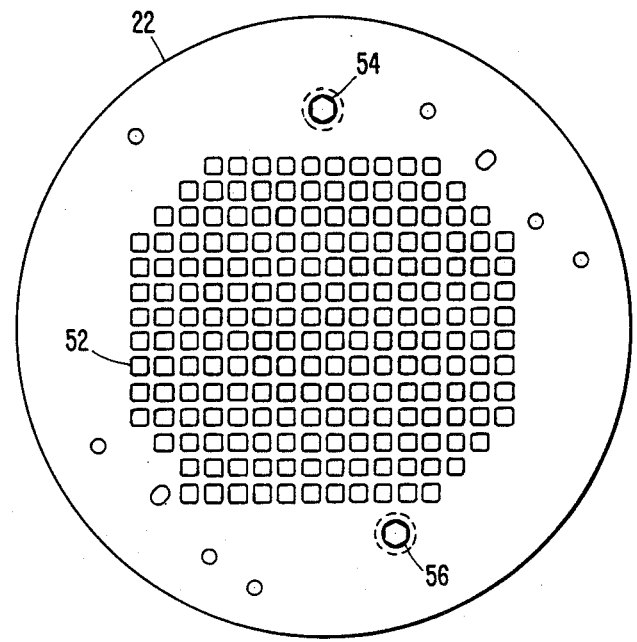
FIG. 3A is a top view of the base plate.
Figure 3B:
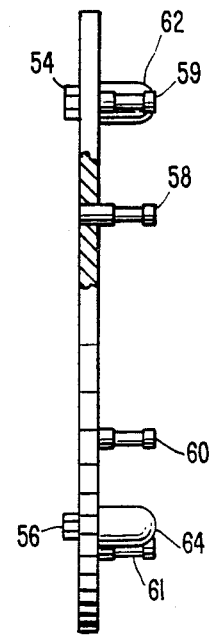
FIG. 3B is a side view of the base plate.

FIGS. 3A and 3B show top and side views of the base plate, respectively. Base plate 22 provides the pedestal for all the other parts of the reusable evaporation fixture. The square locating pin 54 and diamond locating pin 56 which provide references for precise alignment of the thin inner plates 24, 26, 30 and 32 are shown more clearly in these FIGs. Spring pins 58, 59, 60 and 61 provide support for the leaf springs 36 and 38, which force the slide bar 34 into position. There are as many bottom plate openings 52 as there are substrates to be placed in the fixture, as each bottom plate opening 52 corresponds to the position of an individual substrate.

Figure 4A:
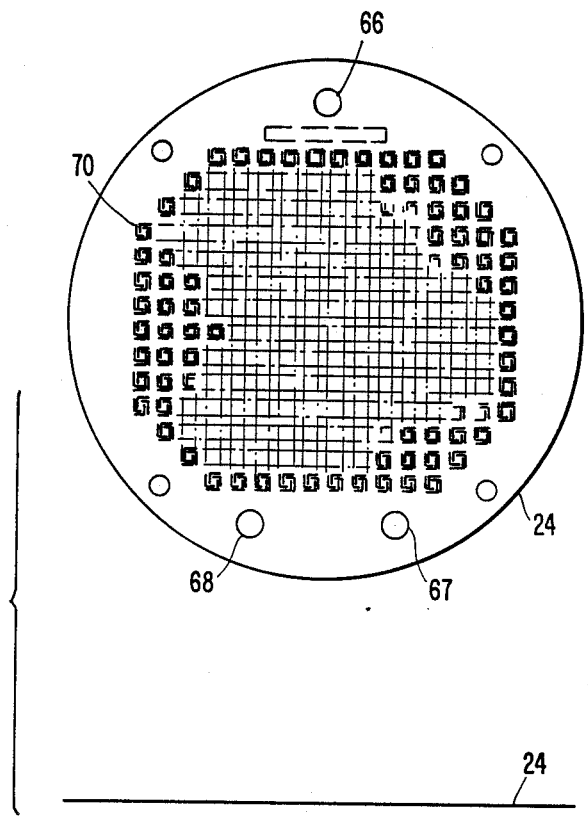
FIG. 4A is a top view of the Z-direction spring plate.
Figure 4B:
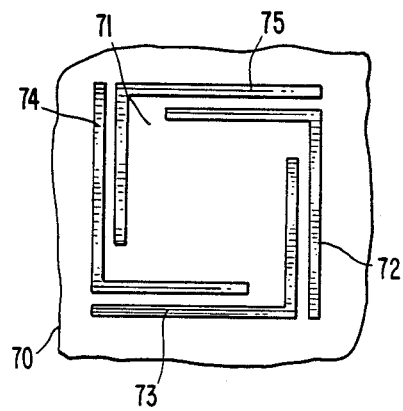
FIG. 4B is a section view of the Z-spring plate, showing a single Z-spring.

FIGS. 4A and 4B show the Z-spring plate 24. FIG. 4A shows the entire Z-spring plate 24, with alignment holes 66, 67 and 68. Alignment hole 66 is for the square-locating pin 54. Alignment holes 67 and 68 are for the diamond-locating pin. The Z-spring plate 24 is reversible, so that the single Z-springs 70 do not have become permanently bent out of position. FIG. 4B shows an individual Z-spring 70. The Z-spring substrate biasing plate 71 provides a supporting surface for the substrate and is held in place by four Z-spring moment arms 72, 73, 74 and 75. When deformed by the clamping of the fixture by spring clips 40, 41, and 42, each individual Z-spring 70 pushes an individual substrate in the Z-direction, perpendicular to the X-Y plane while seated in substrate apertures 80 and 90 of the x-y positioning plate 26 and x-y spring plate 28 respectively, against the contact mask 32. Because each substrate is on its own Z-spring 70, some variance in the thickness of substrates can be accommodated, while allowing all substrates to be urged firmly against the contact mask 32. The amount of substrate thickness variance depends on moment arm design, plate thickness and plate material. The particular design depicted in FIGS. 4A and 4B accepts a +/−0.002 inch substrate thickness variance.

Figure 5A:
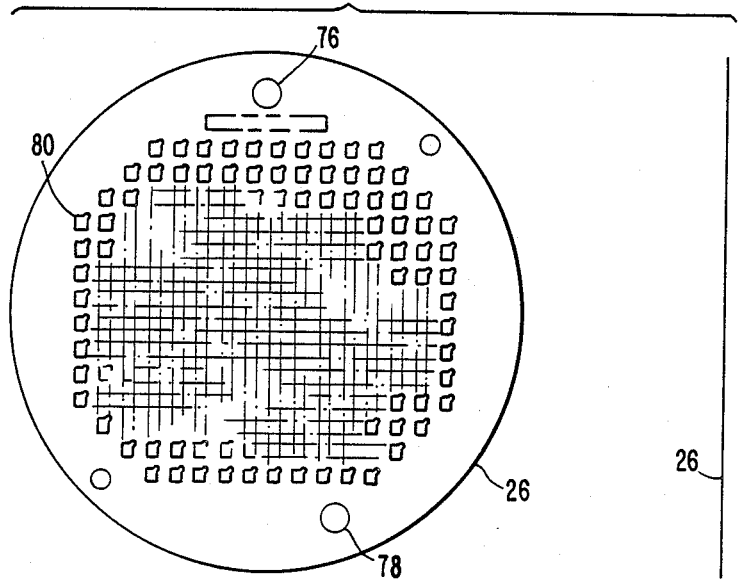
FIG. 5A is an X-Y positioning plate.
Figure 5B:
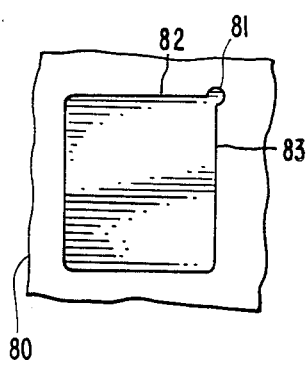
FIG. 5B is a section of the X-Y positioning plate, showing a single substrate pocket.

FIGS. 5A and 5B show the first X-Y positioning plate 26. in FIG. 5A, the entire X-Y positioning plate 26 is shown, with alignment holes 76 and 78, which align the positioning plate 26 to the square locating pin 54 and the diamond locating pin 56, respectively. The X-Y positioning plate 26 provides the function of locating the substrates with respect to the X-Y plane defined by the contact mask. The substrate is forced against the corner of the X-Y positioning aperture 80 into the upper right corner against X-Y alignment faces 82 and 83, which has a corner relief 81 to allow for substrate burrs. Again, as with the Z-spring plate 24, there are as many X-Y positioning pockets 80 as there are substrates to be masked by the contact mask 32.

Figure 6A:
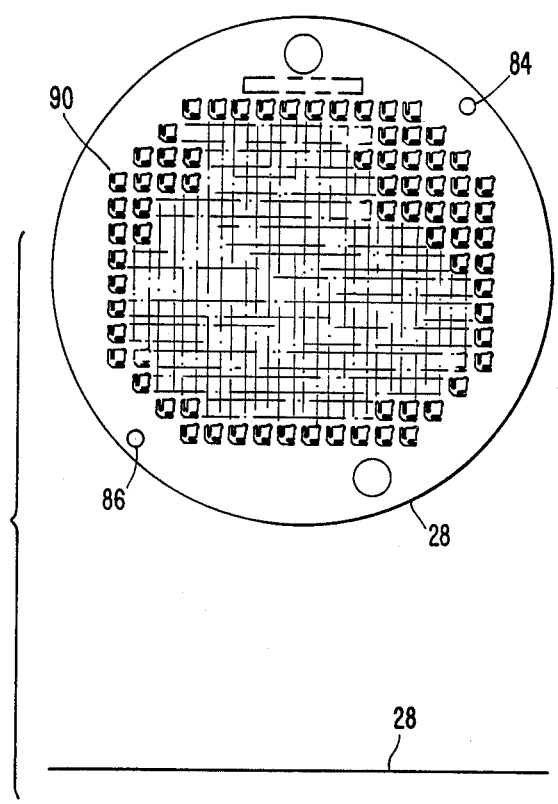
FIG. 6A is a top view of the X-Y spring plate.
Figure 6B:
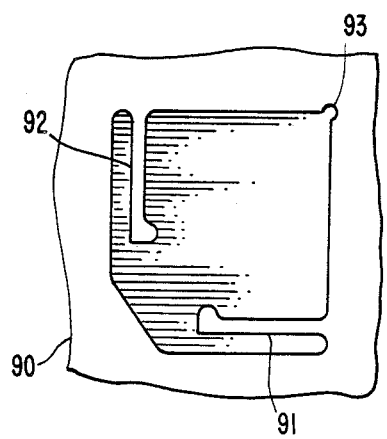
FIG. 6B is a section view of the X-Y spring plate, showing a single substrate pocket.

FIGS. 6A and 6B show the X-Y spring plate 28. FIG. 6A shows the entire X-Y spring plate 28, which has alignment holes 84 and 86 to align the X-Y spring plate to the slide bar pins 35 and 37 located on slide bar 34. The X-Y spring plate 28 provides the function of holding the substrates in place after the mask is removed as well as helping provide the X-Y positioning function. FIG. 6B shows a single X-Y spring plate aperture or pocket 90. After each substrate is placed in the X-Y spring plate aperture 90, while in the "load" positioned X-Y springs 91 and 92 engage and push the substrate in the upper right corner of X-Y positioning plate aperture 80 against X-Y alignment faces 82 and 83 after the independent bar actuating fixture stops pushing the slide bar 34. X-Y springs 91 and 92 flex to allow for some variance in the substrate size. The particular springs shown in FIG. 6B allow for a +/−0.002 inch variance in substrate length or width.

The second X-Y positioning plate 30 is an exact copy of the first X-Y positioning plate 26, illustrated in FIGS. 5A and 5B. The second X-Y positioning plate 30 is not strictly necessary, since the X-Y positioning of the substrates can be accomplished by the first X-Y positioning plate 26 and the X-Y spring plate 28 alone. However, because the second x-y plate 30 holds the top of the substrates while the first x-y plate 26 holds the bottom of the substrates, the addition of a second X-Y positioning plate 30 adds to the stability of the reusable evaporation fixture and holding the substrates there within.

Figure 7A:
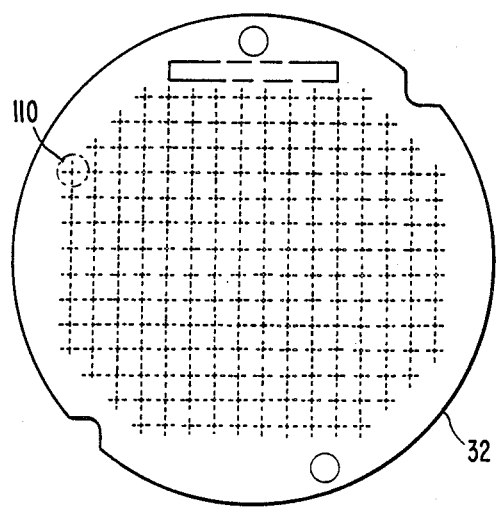
FIG. 7A is a top view of typical mask plate.
Figure 7B:
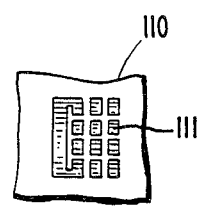
FIG. 7B is a section view of mask plate, showing a single mask site.

FIG. 7A shows a typical evaporation mask 32. FIG. 7B shows a single contact mask site 110. Contact mask apertures 111 are arranged in the geometric pattern in which the deposition material is to be arranged. The geometric patterns could conceivably vary between the contact mask sites 110 to obtain different device characteristics, but generally they are identical over the contact mask 32 to aid in ease of handling.

The reusable evaporation fixture is designed to allow more than one deposition pattern to be formed on the substrate. For example, an island pattern of Cr, Cu, Cr can be deposited directly on the substrate with a first contact mask the first contact mask is removed from the reusable evaporation fixture and using a second contact mask a terminal metal pattern of Cr, Cu, Au and PbSn is deposited on the islands. The island deposition of Cr, Cu, and Cr has thicknesses of approximately 2500 A, 4500 A and 2000 A respectively, and the second evaporation to form terminal metal connections uses thicknesses of Cr, Cu, Au and PbSn of approximately 3000 A, 4500 A, 1000 A and 0.05 inches respectively.

Figure 8A:
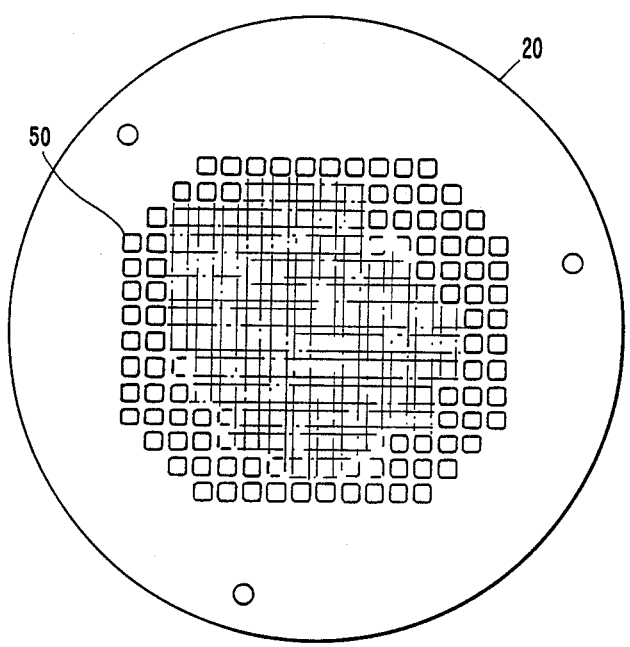
FIG. 8A is a top view of the top plate.
Figure 8B:
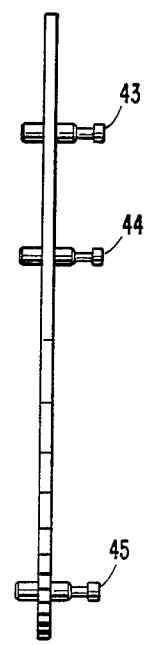
FIG. 8B is a side view of the top plate.

FIGS. 8A and 8B show a top and side view of the top plate 20 respectively. As with the other plates there are an equal number of apertures 50 as there are substrates to be masked. The deposition material is deposited through the apertures 50 and the pattern of apertures 111 onto the individual substrates. Clip pins 43, 44 and 45 provide the means together with the spring clips 40, 41, 42, by which the entire assembly is clamped together. The top plate 20 is designed to mask the majority of the reusable evaporation fixture parts from the deposition material. Only the mask 32 and the top plate 20 need to be cleaned after deposition.

Figure 9A:
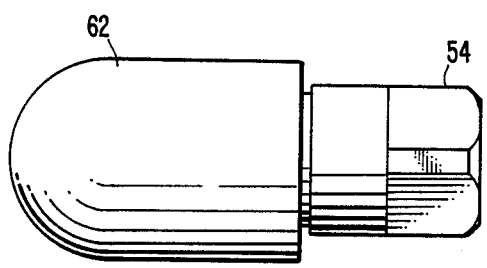
FIGS. 9A and 9B are side and top views, respectively, of the square locating pin of the base plate.
Figure 9B:
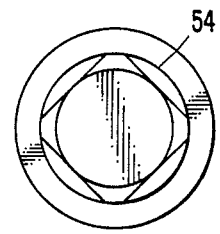
Figure 9C:
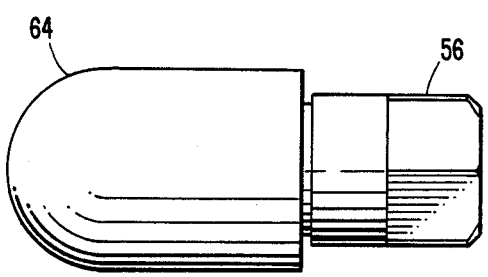
FIGS. 9C and 9D are side and top views of the diamond positioning pin of the base plate, respectively.
Figure 9D:
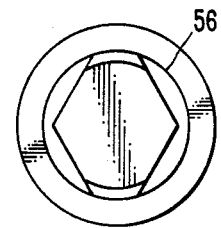

FIGS. 9A and 9B depict the square locating pin 54 and its projection 62. Together with the diamond-locating pin 56, shown in FIGS. 9C and 9D, the square locating pin 54 aligns the inner plates 24, 26, 30 and 32, to the bottom plate 22.

Figure 10:
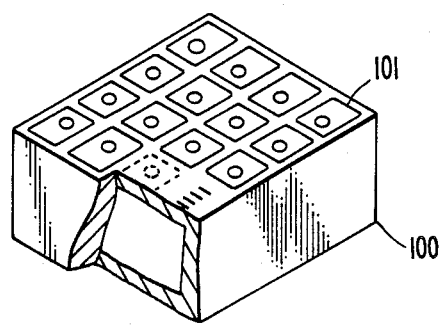
FIG. 10 is a perspective view of a ceramic substrate, to be placed in the reusable evaporation fixture.

FIG. 10 shows an individual substrate 100 with a pattern of material deposited thereon 101. The substrate 100 can vary from lot to lot in thickness and as well as in length and width. The use of spring means in the fixture to urge the substrates against the contact mask 32 and to align the substrates in the X-Y direction, can compensate for much of the variance in dimension. The reusable evaporation fixture is currently being used for evaporation on a ceramic chip capacitor shown in FIG. 10 with approximate dimensions 0.04 inch×0.06 inch×0.07 inch. The chip capacitor consists of laminate comprised mostly of ceramic material layered with metallic electrode capacitor plates fabricated with ceramic laminate punch technology. This process produces individual chips with individual tolerances which then must have the evaporants applied to one face of the chip. A more detailed description of the ceramic chip is contained within commonly assigned U.S. patent application, Ser. No. 212,361, entitled "Improved Multilayer Capacitor," filed June 27, 1988, which is herein incorporated by reference.

Figure 11A:
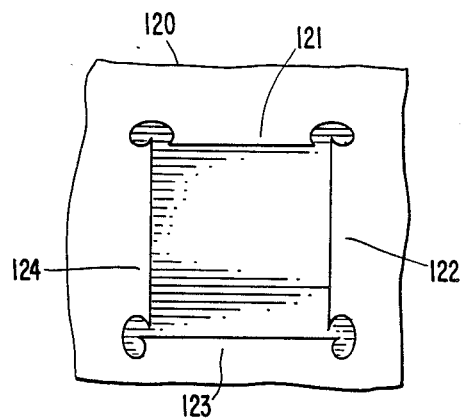
FIGS. 11A and 11B are alternative embodiments of a single substrate pocket on the X-Y spring plate shown in FIGS. 6A and 6B.
Figure 11B:
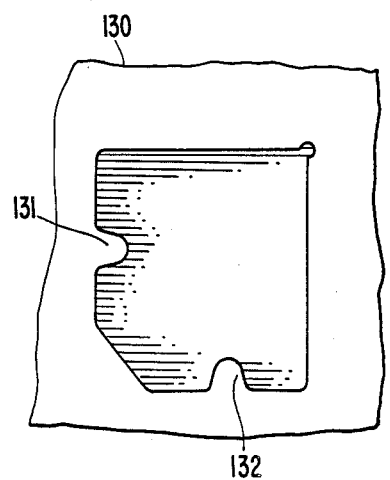

The particular configuration of the reusable evaporation shown in the preceding figures is but one of the many possible built in accordance with the present invention. For example, other means of holding a rectangular or square substrate are shown in FIGS. 11A and 11B. One possible alternate aperture 120 for the X-Y spring plate aperture 90 shown in FIGS. 6A and 6B is shown in FIG. 11A. The springs 121, 122, 123, 124 are curled under the plate and there are four of the springs, rather than the two planar springs 91, 92 shown in FIG. 6B. Shown in FIG. 11B is yet another alternate aperture 130 for the X-Y spring plate aperture 90. Here, in FIG. 11B alignment pins 131, 132 rather than spring means are used. The pins 131 and 132 are used in the same manner as x-y springs 91 and 92 described above. This is possible only if the substrate dimension tolerances can be kept to a minimum, and that the deposition material does not exert a great force on the substrates when the contact mask 32 is removed. Unfortunately, holding minimum substrate tolerances in high volume production drives substrate costs up significantly.

According to the principles of this invention, it is possible to simplify the reusable evaporation fixture to three plates and a contact mask from the preferred embodiment described above. A top plate is necessary to shield the other parts of the fixture from the deposition material and to support the contact mask. An X-Y spring plate, perhaps of greater thickness, may be used alone to provide the necessary X-Y alignment and to secure the individual substrates within the fixture. However, a single plate will sacrifice some of precision in alignment and stability of the substrates. Referring to FIG. 6B, alignment faces 94 and 95 would register the substrates with respect to the contact mask sites, rather than those associated with the X-Y positioning plates. Finally, a plate associated with a plurality of spring means is necessary to urge each individual substrate flush in the Z-direction against the contact mask. For example, a plate could combine the attributes of the base plate and the Z-spring plate by strengthening the Z-spring plate considerably from the thin plate depicted in the Figures above and adding locating pins to align the other parts of the fixture. Other types of Z-springs might be used with such a combination plate, such as a piston type spring, since the thin Z-spring moment arms would be difficult to machine on a thicker plate. Also, since the plate is not reversible, the ability to lengthen the lifetime of the Z-springs by reversing their orientation would be lost.

While the invention has been described in terms of a preferred embodiment, it would be obvious to those skilled in the art that changes in form and detail to the various plates within the reusable evaporation fixture are possible without departing from the spirit and the scope of the invention. For example, the particular fixture shown in the Figures is for use with square or rectangular substrates. Other shaped substrates, such as a circular or triangular substrate, would obviously require different pocket arrangements, spring means and alignment faces, to align and secure them with respect to the X-Y plane of the contact mask. Also, instead of locating pins, other means of registering the various plates of the fixture are possible, such as springs or cams, as taught by the prior art. The specific embodiments disclosed are for purposes of illustration only and are not to be taken to limit the scope of the invention narrower than the scope of the appended claims.

We claim:

1. A reusable evaporation fixture for registering each of a plurality of individual substrates to respective sites of a plurality of contact mask sites of a single contact mask oriented in the X-Y plane comprising:
   a base plate having a top face and a bottom face and having locating means mounted to said top face, for establishing a reference position in said X-Y plane;
   said contact mask located over said top face of said base plate and engaged to said locating means;
   a plurality of Z-spring means supported by said base plate to urge each of said plurality of individual substrates against said contact mask in the Z-direction;
   a second plate over said top face of said base plate and said plurality of Z-spring means and below said contact mask, said second plate having a plurality of means to hold and align each of said plurality of individual substrates against respective X-Y alignment faces, each of said X-Y alignment faces corresponding to a respective site of said plurality of contact mask sites in said X-Y plane said second plate located between said base plate and said contact mask;
   alignment means for aligning said second plate accurately to said contact mask;
   a top plate supporting said contact mask in a configuration which allows deposition material to be deposited through the pattern of said contact mask.

2. The reusable evaporation fixture as recited in claim 1 wherein said top plate prevents deposition material from contacting any other part of said fixture with the exception of said contact mask.

3. The reusable evaporation fixture as recited in claim 1 which further comprises a third plate having a plurality of X-Y alignment faces to accurately align said plurality of individual substrates, said third plate located between said base plate and said contact mask.

4. The reusable evaporation fixture as recited in claim 3 which further comprises:
   a fourth plate having a plurality of X-Y alignment faces located with respect to said locating means to accurately align each of said plurality of individual substrates, said second plate being located between said third and fourth plates and said second, third and fourth plates located between said base plate and said contact mask.

5. The reusable evaporation fixture as recited in claim 1 wherein said alignment means for said second plate is capable of moving said second plate in a plane parallel to said X-Y plane between a "load" position where said plurality of individual substrates are loaded into said reusable evaporation fixture and an "aligned" position where said plurality of individual substrates are forced against said plurality of X-Y alignment faces.

6. A reusable evaporation fixture for registering each of a plurality of individual substrates to respective sites of a plurality of contact masks sites of a single contact mask oriented in the X-Y plane comprising:
   a base plate having at least two locating pins mounted thereto for establishing a reference position in said X-Y plane;
   a first plate having a plurality of spring means to urge each of said plurality of individual substrates in the Z-direction against said contact mask to prevent haloing of a deposition material on said plurality of individual substrates and located with respect to said locating pins to accurately align said first plate to said base plate;
   a second plate having a plurality of spring means to hold and align each of said plurality of individual substrates against X-Y alignment faces and located with respect to said base plate in the X-Y direction by a positioning means;

a positioning means which positions said second plate to said base plate;

said contact mask having a plurality of patterned apertures to pattern said deposition material on each of said plurality of individual substrates and located with respect to said locating pins to accurately align said contact mask in said X-Y plane; and, a top plate supporting said contact mask having a plurality of apertures which allow said deposition material to deposit through said patterned apertures.

7. The reusable evaporation fixture as recited in claim 6 wherein said top plate prevents said deposition material from contacting any other part of said fixture with the exception of said contact mask.

8. The reusable evaporation fixture as recited in claim 6 which further comprises:

a third plate having a plurality of X-Y alignment faces located with respect to said locating pins to accurately align said plurality of individual substrates, said third plate contacting said second plate.

9. The reusable evaporation fixture as recited in claim 8 which further comprises:

a fourth plate having a plurality of X-Y alignment faces located with respect to said locating pins to accurately align said plurality of individual substrates, said fourth plate contacting said second plate.

10. The reusable evaporation fixture as recited in claim 6, wherein said alignment means for said second plate is capable of moving said second plate between a "load" position where said plurality of individual substrates are loaded into said reusable evaporation fixture and an "aligned" position where said plurality of individual substrates are forced against said plurality of X-Y alignment faces.

11. The reusable evaporation fixture as recited in claim 6 wherein said spring means of said first plate accommodate a substrate thickness variation of +/−0.002 inches.

12. The reusable evaporation fixture as recited in claim 6 wherein said spring means of said second plate accommodate substrate heights and width variations of +/−0.002 inches.

13. A reusable evaporation fixture for registering each of a plurality of individual substrates to respective mask sites of a plurality of contact mask sites of a single contact mask oriented in the X-Y plane comprising:

a base plate oriented in a plane parallel to said X-Y plane having a top face and having locating means mounted thereto to align other parts of said reusable evaporation fixture to a reference position in said X-Y plane;

a first plate located over said top face of said base plate having a plurality of spring means to urge each of said plurality of individual substrates against said contact mask in the Z-direction to prevent haloing of a deposition material on said plurality of individual substrates;

an alignment plate located over said first plate having a plurality of X-Y alignment surfaces, each corresponding to respective sites of said plurality of contact mask sites, said alignment plate having means to receive said locating means to accurately align said alignment plate with respect to said base plate;

a second plate, moveable in a plane parallel to said X-Y plane, located over said first plate and contacting said alignment plate on a first side having a plurality of spring means to hold and align each of said plurality or individual substrates against said X-Y alignment faces, said second plate located between said first plate and said contact mask;

second plate alignment means for aligning said second plate to said base plate;

said contact mask located over said first, second and alignment plates having a plurality of pattern apertures to pattern said deposition material on each of said plurality of individual substrates and having means to receive said locating means to accurately align said contact mask to said base plate; and a top plate located over said contact mask and supporting said contact mask having a plurality of apertures which allow said deposition material to deposit through said patterned apertures, said top plate otherwise preventing deposition on other parts of said reusable evaporation fixture.

14. The reusable evaporation fixture as recited in claim 13 which further comprises:

a second alignment plate located between said first plate and said contact mask having a plurality of X-Y alignment faces corresponding to respective sites of said plurality of contact mask sites, said second alignment plate having means to receive said locating means to accurately align said second alignment plate to said base plate, said alignment plate contacting a second side of said second plate.

15. The reusable evaporation fixture as recited in claim 13 wherein said second plate alignment means comprises:

a slide bar having slide bar pins;

slide bar pin receiving means located on said second plate, said slide bar moving said second plate in a plane parallel to said X-Y plane between a "load" position where said plurality of individual substrates are loaded into said reusable evaporation fixture and an "aligned" position where each of said plurality of individual substrates is urged against X-Y alignment faces corresponding to respective sites of said plurality of contact mask sites.

* * * * *